(12) United States Patent  (10) Patent No.: US 7,871,283 B2
Murakoshi et al.  (45) Date of Patent: Jan. 18, 2011

(54) SEMICONDUCTOR PACKAGE SOCKET

(75) Inventors: Eiichi Murakoshi, Osaka (JP); Hideki Sato, Chiba (JP); Hideki Sagano, Kawasaki (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 12/302,750

(22) PCT Filed: Dec. 3, 2007

(86) PCT No.: PCT/JP2007/073320

§ 371 (c)(1),
(2), (4) Date: Nov. 26, 2008

(87) PCT Pub. No.: WO2009/072173

PCT Pub. Date: Jun. 11, 2009

(65) Prior Publication Data

US 2010/0261370 A1  Oct. 14, 2010

(51) Int. Cl.
*H01R 11/22* (2006.01)

(52) U.S. Cl. ...................................... 439/266

(58) Field of Classification Search ............ 439/68–73, 439/260–270, 331
See application file for complete search history.

(56) References Cited

U.S. PATENT DOCUMENTS

| 4,691,975 | A | | 9/1987 | Fukunaga et al. | |
| 5,147,212 | A | * | 9/1992 | Uratsuji et al. | 439/266 |
| 5,288,240 | A | * | 2/1994 | Savant | 439/266 |
| 5,290,192 | A | * | 3/1994 | Espenshade et al. | 439/266 |
| 5,387,118 | A | * | 2/1995 | Kishi et al. | 439/266 |
| 5,461,258 | A | | 10/1995 | Ideta et al. | |
| 5,908,324 | A | * | 6/1999 | Ohshima et al. | 439/266 |
| 6,213,803 | B1 | * | 4/2001 | Kato et al. | 439/266 |
| 6,902,418 | B2 | * | 6/2005 | Watanabe et al. | 439/266 |

FOREIGN PATENT DOCUMENTS

| JP | 62-93964 | 4/1987 |
| JP | 6-231845 | 8/1994 |
| JP | 8-227772 | 9/1996 |
| JP | 10-50441 | 2/1998 |
| JP | 10-144436 | 5/1998 |
| JP | 2003-297505 | 10/2003 |

* cited by examiner

*Primary Examiner*—Jean F Duverne
(74) *Attorney, Agent, or Firm*—Finnegan, Henderson, Farabow, Garrett & Dunner, LLP

(57) ABSTRACT

A semiconductor package socket (1, 101) has a socket base (10, 110) including a package rest (11, 111) on which a semiconductor package (50) having gull-wing leads (52) is put, a cover member (20, 120) movably attached on the socket base, and a plurality of contacts (30, 130) each including a first contact piece (31, 131) capable of making contact, from above, with a horizontal shoulder portion of the lead, a second contact piece (32, 132) capable of making contact, laterally, with a vertical leg portion of the lead and a fixed portion, and formed to advance onto or retract from the package rest due to vertical movement of the cover member. The package rest is formed with a dam wall that allows the leads to be lied thereover, wherein the first and the second contact pieces each have an elastic deforming portion to determine a contact pressure.

6 Claims, 13 Drawing Sheets

SEMICONDUCTOR PACKAGE SOCKET

TECHNICAL FIELD

The present invention relates to semiconductor package sockets and more particularly to a two-point-contact type semiconductor package socket adapted to make contact, at two points, with the lead of a gull-wing type semiconductor package.

BACKGROUND ART

Open-top semiconductor package sockets (hereinafter, also referred merely to as "IC sockets"), for use in reliability tests of semiconductor packages having gull-wing leads, are conventionally well known. Such an IC socket is required not to injure the tip of the lead of a semiconductor package in a reliability test, in order to ensure positive soldering during mounting of the semiconductor package onto an electronic apparatus. For this reason, when conducting a reliability test, it is a practice to employ a contact-at-shoulder scheme or a lateral-contact scheme, in contacting between the gull-wing lead of the semiconductor package and the contact of the IC socket. Furthermore, there is a proposal of a two-point-contact type IC socket as disclosed in Patent Document 1, in order to ensure stable contact while avoiding the contact and the gull-wing lead from being blocked in contact by scattering of mold resin waste from the semiconductor package or so. The two-point-contact type IC socket disclosed in Patent Document 1 is structured such that one of two contact portions possessed by the contact first goes into contact with a bend portion connecting between a shoulder straight portion and a leg portion of a gull-wing lead and then the other contact portion comes into contact with the leg portion of the gull-wing lead.

Patent Document 1: Japanese Patent Laid-Open No. 2003-297505

DISCLOSURE OF THE INVENTION

In the two-point-contact type IC socket disclosed in Patent document 1, the contact's contact portion for contacting a lead leg portion is structured to make horizontal contact with the lead leg portion. There is a fear that contact pressure increases between the contact portion and the lead leg portion, resulting in a fear of deforming the lead. Particularly, where the semiconductor package is increased in density and the number of leads increases as in the recent, lead diameter also decreases to raise the fear of lead deformation to a greater extent.

It is an object of the present invention to provide a two-point-contact type semiconductor package socket capable of suppressing the contact pressure with a leg portion of a semiconductor package gull-wing lead from increasing and preventing, to a possible extent, the lead leg portion from flexing.

In order to achieve the above object, a two-point-contact type semiconductor package socket according to the present invention is characterized by comprising: a socket base including a package rest on which a semiconductor package is to be placed that has gull-wing leads including at least a horizontal shoulder portion extending nearly horizontally from a main body and a vertical leg portion being bent nearly vertically from the horizontal shoulder portion; a cover member vertically movably attached on the socket base through an elastic member; a plurality of contacts each including at least a first contact piece capable of making contact, from above, with the horizontal shoulder portion of the gull-wing lead of the semiconductor package placed on the package rest, a second contact piece capable of making contact, laterally, with the vertical leg portion of the gull-wing lead of the semiconductor package and a fixed portion that is fixed in the socket base, and formed to advance onto the package rest or retract from the package rest due to vertical movement of the cover member; wherein the package rest being formed with a dam wall that allows the gull-wing lead of the semiconductor package to lie thereover when the semiconductor package is placed on; the first contact piece and the second contact piece, of the contact, each having an elastic deforming portion that is elastically deformable to determine a contact pressure in a manner making contact with the gull-wing lead of the semiconductor package at a predetermined contact pressure.

In the two-point-contact type semiconductor package socket according to the invention, the first contact piece and the second contact piece, of the contact, also may be formed to simultaneously advance onto the package rest or retract from the package rest due to vertical movement of the cover member, by virtue of the elastic deforming portion that determines the contact pressure of the first contact piece.

In the two-point-contact type semiconductor package socket according to the invention, the first contact piece and the second contact piece, of the contact, furthermore, may have respectively elastic deforming members, the respective elastic deforming members being to determine respective ones of the contact pressure and formed to advance onto the package rest or retract from the package rest due to vertical movement of the cover member.

In the two-point-contact type semiconductor package socket according to the invention, when the contact makes contact with the semiconductor package placed on the package rest, the first contact piece of the contact can make contact, from above, with the horizontal shoulder portion of the gull-wing lead of the semiconductor package. Meanwhile, the tip portion of the second contact piece can make contact with the vertical leg portion of the gull-wing lead of the semiconductor package at a small contact pressure because the second contact piece has separately an elastic deforming portion. The two-point-contact type semiconductor package socket according to the invention, structured like this, does not deform the gull-wing lead of the semiconductor package and further can positively suppress the poor electric contact caused by leap up of the semiconductor package.

BRIEF DESCRIPTION OF THE DRAWINGS

FIG. 6A is a partial sectional view in a generally right half of the two-point-contact type IC socket according to the first embodiment that is similar to F*ig*. 4, showing a state that a first contact piece of the contact first goes into contact with the lead of a semiconductor package placed on;

FIG. 6B is a partial sectional view in a generally right half of the two-point-contact type IC socket according to a modification to the first embodiment that is similar to Fig. 4, showing a state that a second contact piece of the contact first goes into contact with the lead of a semiconductor package placed on;

FIG. 10A is a partial sectional view in a generally right half of the two-point-contact type IC socket according to the second embodiment that is similar to FIG. 8, showing a state that a first contact piece of the contact first goes into contact with the lead of a semiconductor package placed on;

FIG. 10B is a partial sectional view in a generally right half of a two-point-contact type IC socket according to a modification to the second embodiment that is similar to FIG. 8, showing a state that a second contact piece of the contact first goes into contact with the lead of a semiconductor package placed on.

BEST MODE FOR CARRYING OUT THE INVENTION

In the following, a two-point-contact type semiconductor package socket according to the present invention is explained by use of the drawings.

First Embodiment

Figure 1:
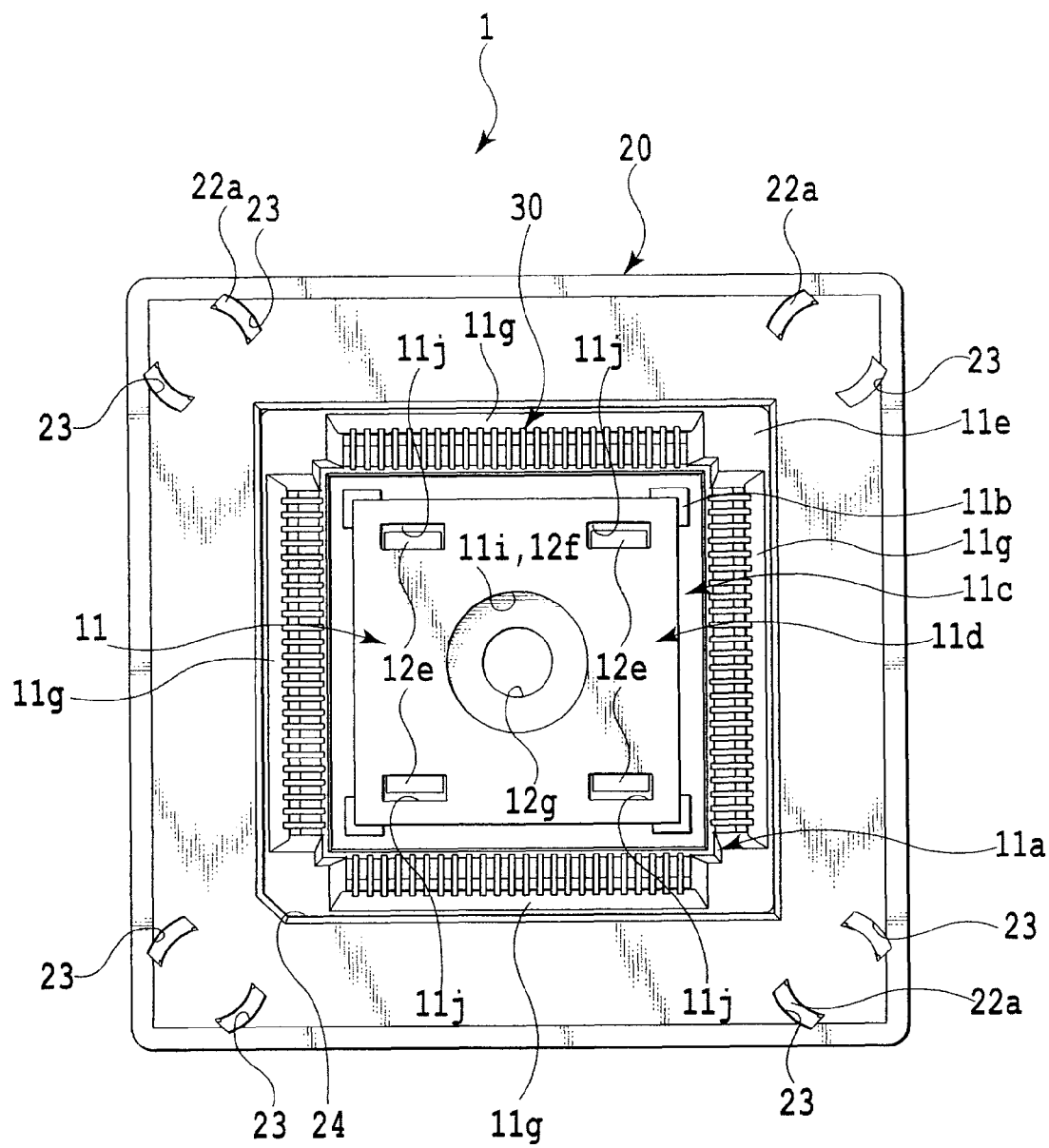
FIG. 1 is a top view of a two-point-contact type IC socket according to a first embodiment of the invention, in a state a semiconductor package is not attached.
Figure 2:
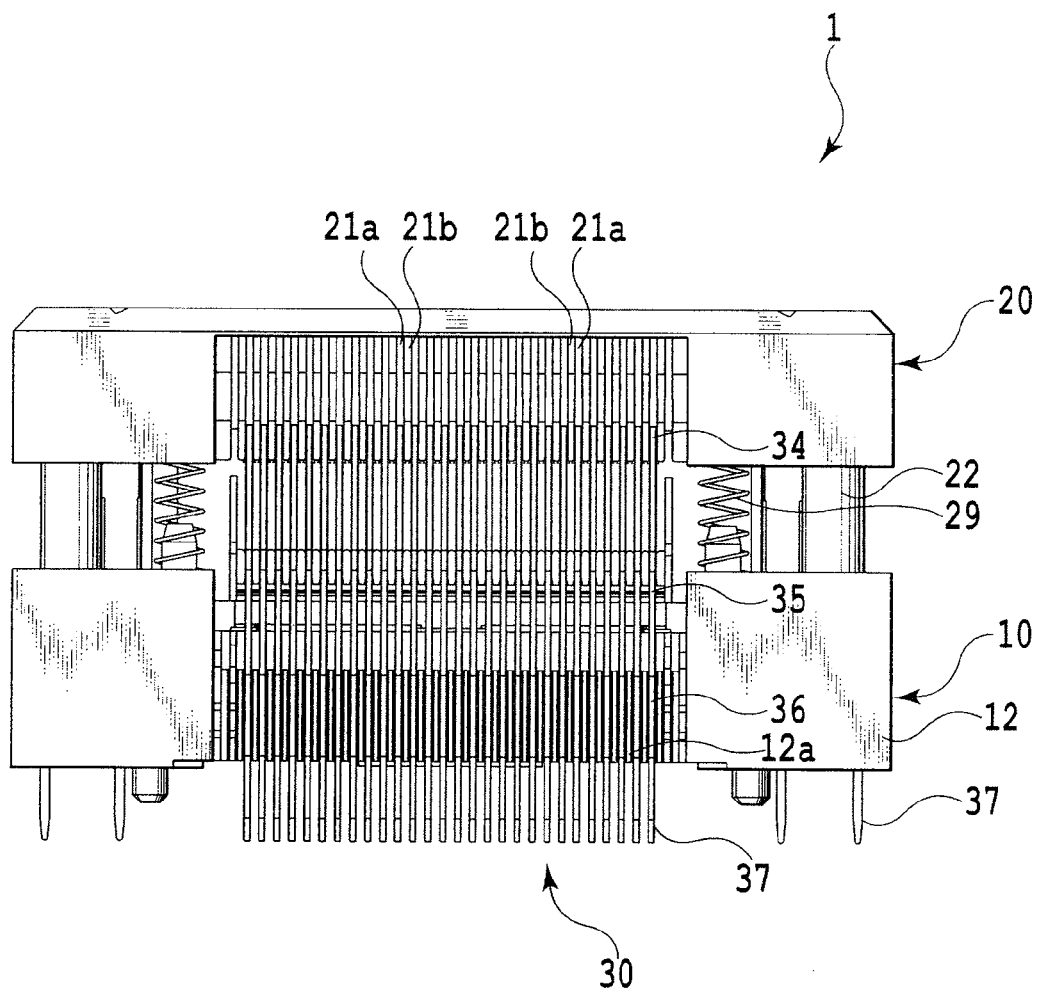
FIG. 2 is a side view of the two-point-contact type IC socket shown in FIG. 1.
Figure 3:
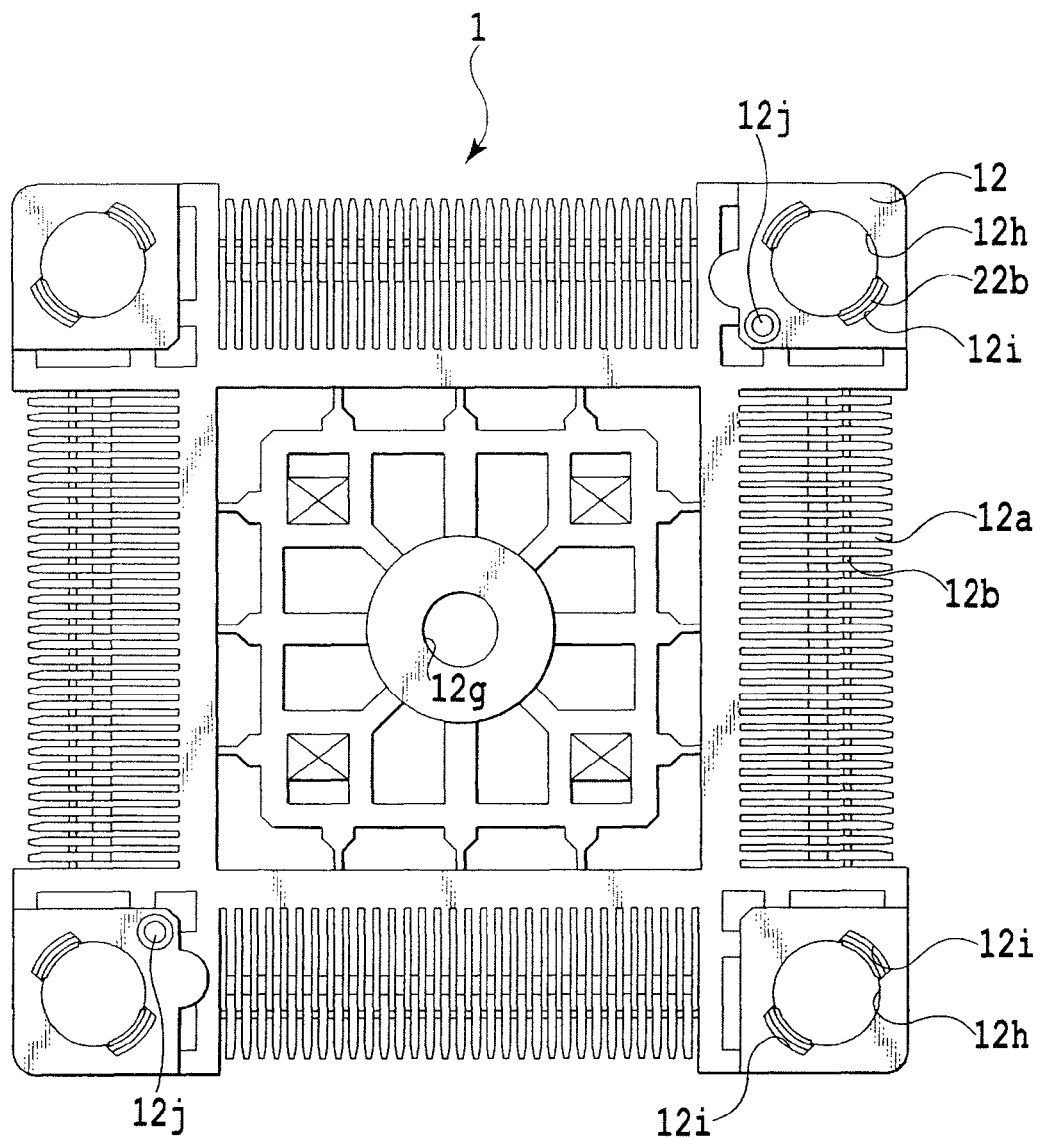
FIG. 3 is a bottom view of the two-point-contact type IC socket shown in FIG. 1, in a state contacts are not attached.
Figure 4:
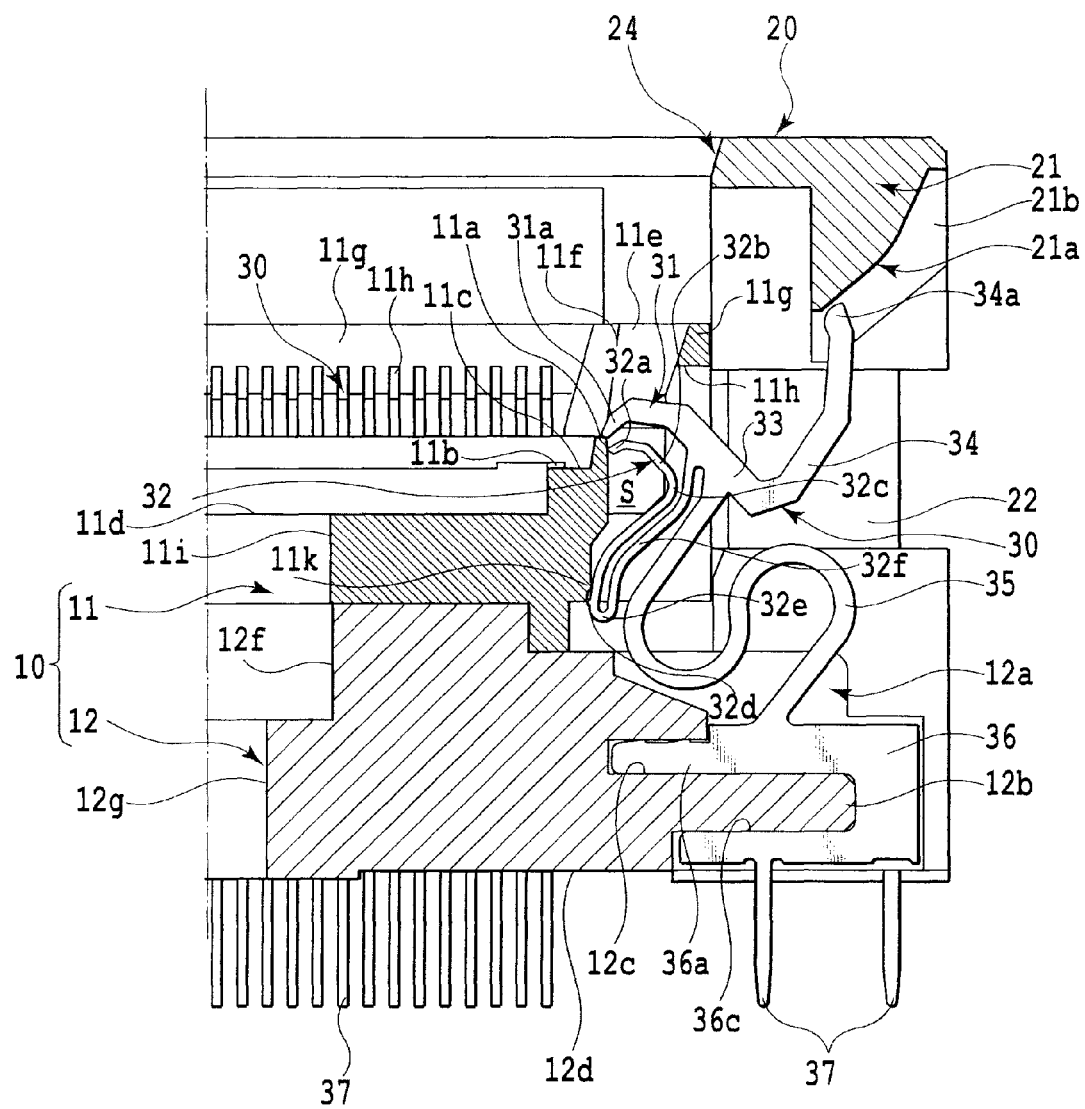
FIG. 4 is a partial sectional view in a generally right half of the two-point-contact type IC socket shown in FIG. 1.
Figure 5:
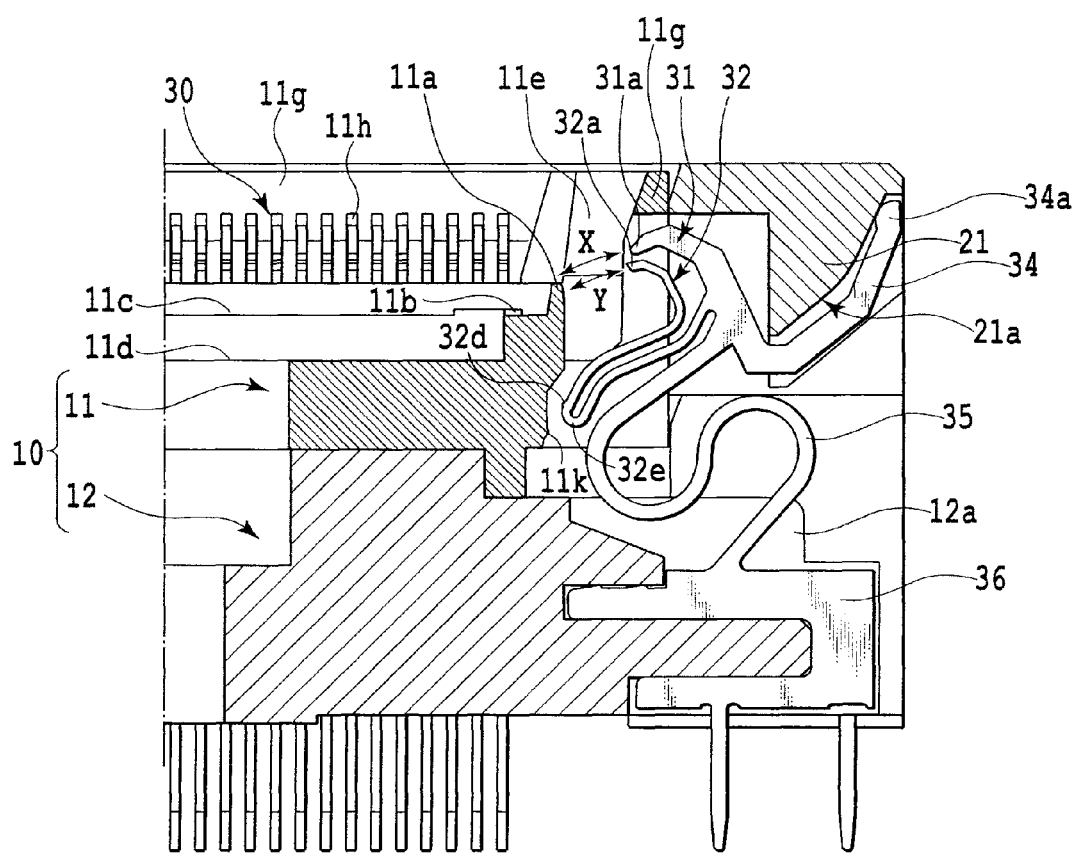
FIG. 5 is a partial sectional view in a generally right half of the two-point-contact type IC socket according to the first embodiment that is similar to F*ig*. 4, showing a state that the contacts of the IC socket shown in F*ig*. 4 are opened in order to attach a semiconductor package.
Figure 6A:
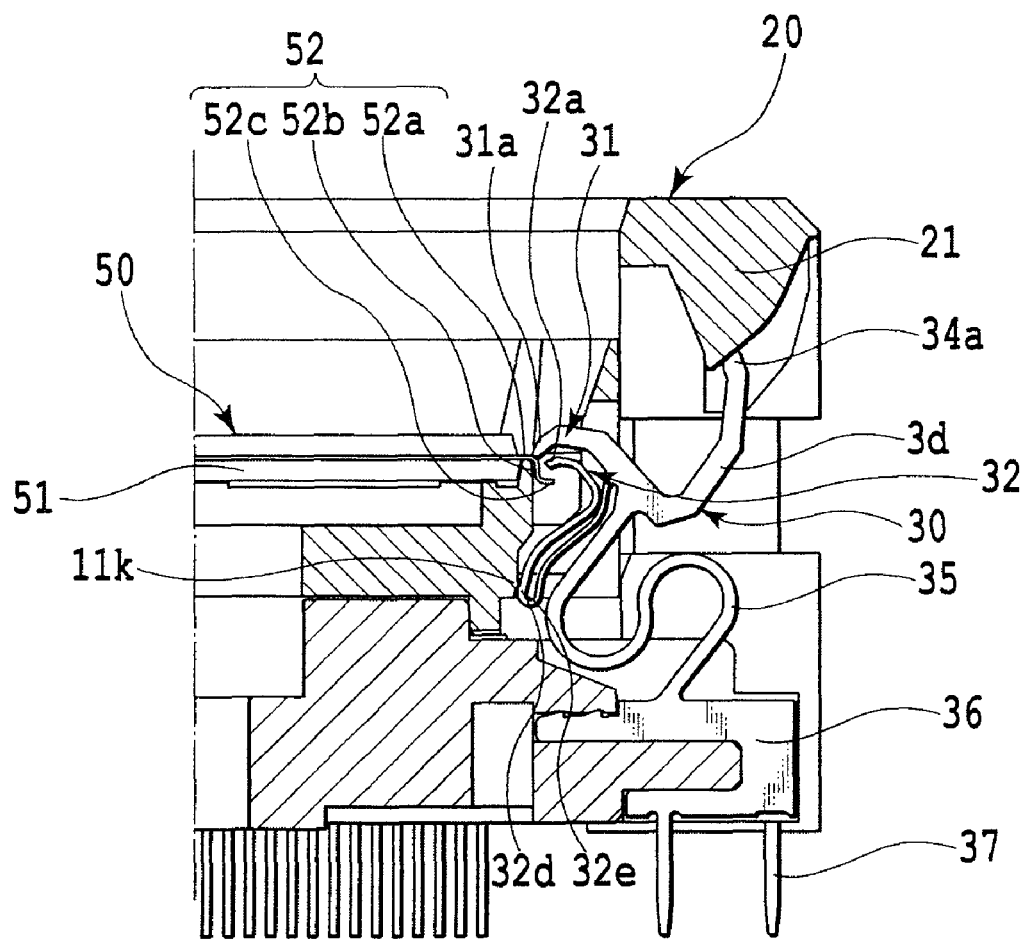
Figure 6B:
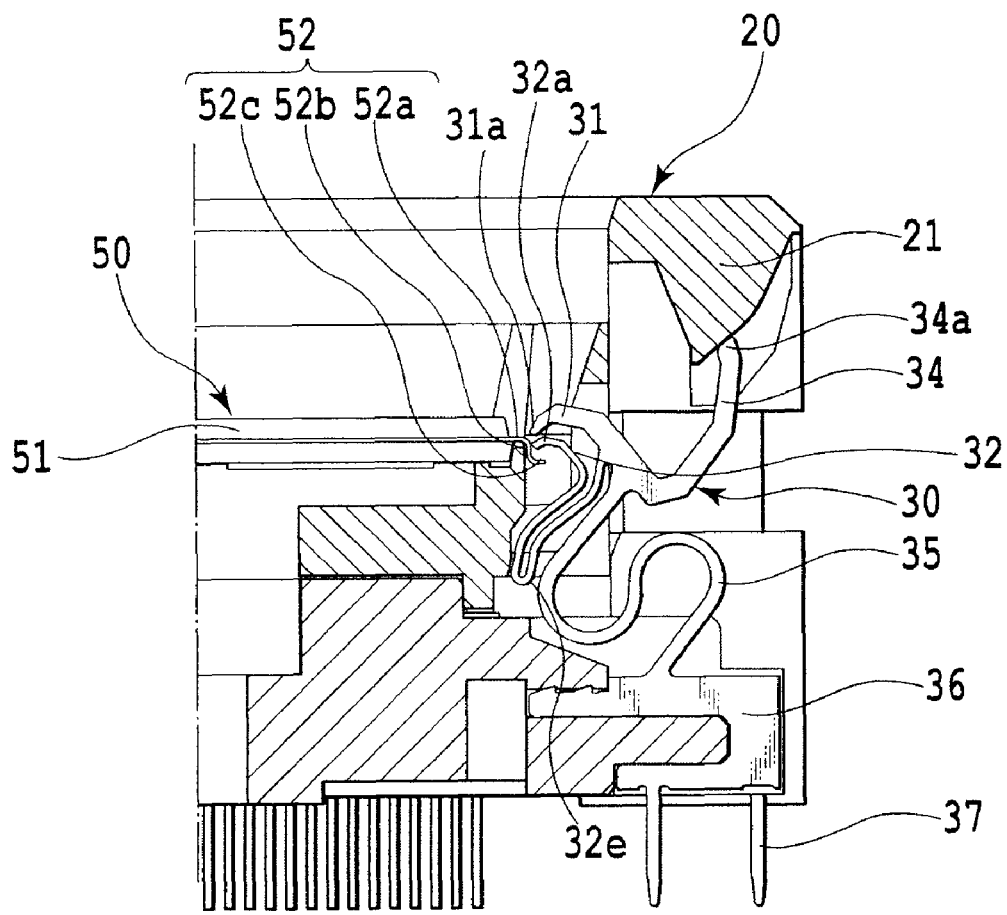
Figure 7:
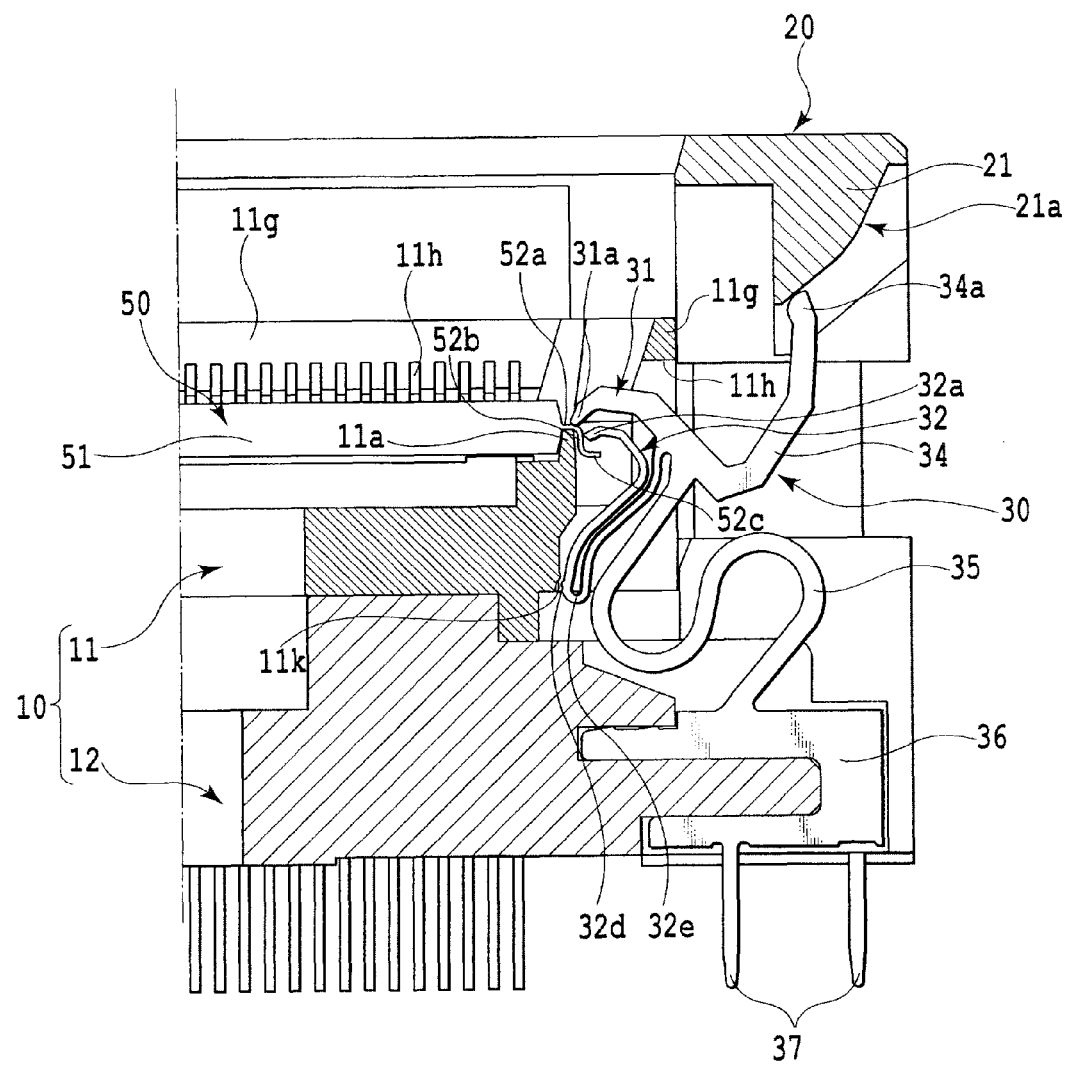
FIG. 7 is a partial sectional view in a generally right half of the two-point-contact type IC socket according to the first embodiment that is similar to Fig. 4, showing a state that attaching a semiconductor package is completed.

In FIGS. 1 to 7, a two-point-contact type IC socket according to a first embodiment and modification thereto of the invention is shown. FIG. 1 is a top view of a two-point-contact type IC socket according to a first embodiment of the invention, which is in a state a semiconductor package is not yet mounted, FIG. 2 is a side view of the two-point-contact type IC socket shown in FIG. 1, and FIG. 3 is a bottom view of the two-point-contact type IC socket shown in FIG. 1, which is in a state contacts are not attached. FIG. 4 is a partial sectional view in a generally right half of the two-point-contact type IC socket shown in FIG. 1. FIG. 5 is a partial sectional view in a generally right half of the two-point-contact type IC socket according to the first embodiment that is similar to FIG. 4, showing a state that the contacts of the IC socket shown in FIG. 4 are opened in order to attach a semiconductor package. FIG. 6A is a partial sectional view in a generally right half of the two-point-contact type IC socket according to the first embodiment that is similar to FIG. 4, showing a state that a first contact piece of the contact first goes into contact with the lead of the semiconductor package placed on. FIG. 6B is a partial sectional view in a generally right half of the two-point-contact type IC socket according to a modification to the first embodiment that is similar to FIG. 4, showing a state that a second contact piece of the contact first goes into contact with the lead of the semiconductor package placed on. FIG. 7 is a partial sectional view in a generally right half of the two-point-contact type IC socket according to the first embodiment that is similar to FIG. 4, showing a state that attaching a semiconductor package is completed.

In the two-point-contact type IC socket 1 of the present embodiment, a semiconductor package 50 of a QFP (quad flat package) type is assumably attached whose leads 52, for example, are extended from four side surfaces of a generally square package body 51 and formed in a gull-wing form. The semiconductor package 50 concretely includes a package body 51 integrally molded in a manner incorporating a chip therein and a plurality of gull-wing leads 52 extended from the four side surfaces of the package body 51, as shown in FIGS. 6A, 6B and 7. Each of the gull-wing leads 52 includes a horizontal shoulder portion 52a extended from the package body 51, a vertical leg portion 52b and a horizontal tip portion 52c. Furthermore, the vertical leg portion 52b is bent downward in a manner defining generally a rectangle to the horizontal shoulder portion 52a while the horizontal tip portion 52c is bent outward (oppositely to the package body 51) in a manner defining generally a rectangle to the vertical leg portion 52b. Consequently, the horizontal shoulder portion 52a and the horizontal tip portion 52c are generally in parallel with.

The two-point-contact type IC socket 1 of the present embodiment is formed generally square as viewed from above, taking the entire form of a rectangular parallelepiped. The two-point-contact type IC socket 1 of the present embodiment has a socket base 10, a cover member 20 and a plurality of contacts 30, as shown in FIGS. 1 to 4.

The socket base 10 includes a socket base body 12 and a package rest 11 fixed on the socket base body 12 and for placing a semiconductor package 50 thereon.

The socket base body 12 is made of an electrically insulated synthetic resin, sustaining a cover member 20 vertically movably and supporting a plurality of contacts 30. In four side regions of the socket base body 12, engaging convexes 12b and engaging concaves 12c are formed in the order from a bottom 12d side toward above such that the contacts 30 can be fixed by fitting those with the engaging concaves 36c and engaging convexes 36a that are formed in fixing portions 36 of the contacts 30. In addition, a plurality of partition walls 12a are formed orthogonal to the engaging convexes 12b and engaging concaves 12c in order to prevent the adjacent ones of the contacts 30 from electrically short-circuiting to each other. Consequently, the contacts 30 are supported in the socket base body 12 by being fixed at the fixed portions 36 of the contact 30 between the adjacent ones of the partition walls 12a.

In four corners of the socket base body 12, guide holes 12h, in which guide members 22 provided on the cover member 20 are to slide, are formed in a manner penetrating through the socket base body 12, as shown in FIG. 3. In the guide hole 12h, an engaging groove 12i, along which an engaging claw 22b formed on the guide member 22 is to slide, is formed vertical along an outer periphery of the guide hole 12h in order to prevent the guide member 22 from moving off the guide hole 12h. In the engaging groove 12i, an engaging protrusion (not shown) is formed in a position above from the bottom 12d by a vertical stroke of the cover member 20. Consequently, by engaging the engaging claw 22b of the guide member 22 with the engaging protrusion, the guide member 22 is prevented from moving up furthermore in the guide hole 12h. The engaging groove 12i extending along the guide hole 12h and the engaging claw 22b of the guide member 22 are preferably provided in opposite positions to each other. Incidentally, 12j is a positioning projection for mounting an IC socket 1 on a test board while 12f, 12g is a through-hole provided in the center of the socket base body. In the present embodiment, 12f is formed equal in diameter to a through-hole 11i formed in the package rest 11 while 12g is formed in two stages smaller in diameter than that, which however is not limitative.

The package rest 11 is made of an electrically insulated synthetic resin and formed generally square as viewed from above, similarly to the socket base body 12. The package rest 11 is fixed on the socket base body 12 at its nearly center thereof. The package rest 11 is formed therein with a through-hole 11j rectangular in horizontal section having a step intermediately thereof. Consequently, the package rest 11 is fixed by placing the engaging claw 12e formed in the upper surface of the socket base body 12 into engagement with the step formed intermediately in the through-hole 11j (see FIG. 1). Incidentally, in the present embodiment, although the package rest 11 is explained formed separate from the socket base body 12, it may be formed integral therewith.

In outer periphery of the upper surface 11c of the package rest 11, a dam wall 11a is formed in a manner surrounding the four sides of the package body 51 of a square semiconductor package 50 placed on. When a semiconductor package 50 is placed on the package rest 11, gull-wing leads 52 of the semiconductor package 50 are put in a manner extending over the dam wall 11a, as shown in FIG. 6A for example. In other words, the dam wall 11a is formed such that, when a semiconductor package 50 is placed on the package rest 11, it sustains the gull-wing leads 52 of the semiconductor package 50.

A recess lid rectangular in horizontal section is formed inner of the dam wall 11a in the upper surface 11c of the package rest 11, and a through-hole 11i is further formed in the center thereof. In addition, support projections 11b are formed at four corners of the recess 11d and on the upper surface 11c of the package rest 11. The support projections 11b are provided so as to relieve the gull-wing leads 52 sustained on the dam wall 11a from flexing when the semiconductor package 50 is pushed by a finger or a handler upon taking out the semiconductor package 50. The through-hole 11i serves as an escape for a screw head in the case, for example, of using a screw in mounting an IC socket 1 to the test board.

At outer four corners of the dam wall 11a in the upper surface 11c of the package rest 11, positioning members 11e are formed that have slant surfaces 11f to guide the mold portion 51 of the semiconductor package 50 inside the dam wall 11a, similarly to the conventional device. In addition, frame members 11g connecting between the positioning members 11e provided at the four corners are formed parallel with the dam wall 11a. The frame member 11g is generally in an L-form in vertical section. In the frame member 11g, a plurality of slits 11h are vertically formed parallel one with another. In each of the slits 11h, a contact 30 is arranged so as to allow its first and second contact pieces 31 and 32 to advance and retract relative to the dam wall 11a of the package rest 11. Namely, partition walls defining between the plurality of slits 11h are formed corresponding to the partition walls 12a formed in the socket base body 12.

In the present embodiment, a delaying cam protrusion 11k is provided in the package rest 11 in a position below the outer side surface of the dam wall 11a. The delaying cam protrusion 11k is in a convex form generally arcuate in vertical section, extending horizontally along the four outer side surfaces of the package rest 11. The delaying cam protrusion 11k is a member that delays a tip portion 32a of the second contact piece 32 of the contact 30 from advancing toward the dam wall 11a by sliding, while contacting therewith, the delaying protrusion 32d of a U-curve portion 32e of the second contact piece 32 of the contact 30 referred later.

Next, the cover member 20 is made of an electrically insulated synthetic resin similarly to the package rest 11 and socket base body 12 of the socket base 10, and formed generally square as viewed from above and rectangular as a whole thereof. In the center of the cover member 20, an opening 24 square in horizontal section is formed through which the positioning member lie of the package rest 11 can be moved in/out.

As mentioned above, the cover member 20 is supported for vertically movable relative to the socket base body 12 of the socket base 10. Specifically, at four corners of the cover member 20, guide members 22 are provided to move vertically in the guide holes formed in the socket base body 12.

The guide members 22 are fit in the attaching holes (not shown) provided at the four corners of the cover member 20 and fixed to the cover member 20. The guide members 22 are formed with engaging claws 22a, 22b corresponding to the vertical positions wherein the engaging claws 22b provided in the lower are to slide in the engaging grooves 12i provided in the socket base body 12. The engaging claws 22a provided in the upper are fixed to the cover member 20 by being engaged with the engaging protrusions (not shown) provided in the positioning grooves 23 vertically formed in the attaching holes provided in the cover member 20. When fixing the guide members 22 to the cover member 20, the guide members 22 are preferably held at their upper ends from above of the cover members 20 by means of members like tapping screws in a manner not to slide the guide members 22 in the attaching holes. Incidentally, the positioning grooves 23 are formed through the cover member 20 and formed corresponding to the engaging grooves 12i formed along the guide holes 12h of the socket base body 12. In the present embodiment, although the guide members 22 in explanation were formed separately from the cover member 20, those may be formed integral with the cover member 20.

In the four side regions of the cover member 20, cams 21 are provided. Cam surfaces 21a are formed along the lower and side surfaces of the cams 21, which are corresponding to the drive levers 34 of the contacts 30 fixedly supported by the socket base body 12. The cam surfaces 21a are formed such that, when the cover member 20 is pushed down, those are brought into abutment against the drive levers 34 of the contacts 30, to move the plurality of contacts 30 simultaneously from the inner to the outer (i.e. in a direction retracting from the dam wall 11a of the package rest 11). The cam surfaces 21a are formed respectively between the adjacent ones of the partition walls 21b, along the side surfaces of the cams 21. Namely, each of the cams 21 are structured such that the follower portion 34a of the driving lever 34 of the corresponding contact 30 lies between the adjacent ones of the partition walls 21b.

Between the cover member 20 and the socket base body 12, compression coiled springs 29 as elastic members are arranged in parallel with the guide members 22, as shown in FIG. 2 for example. The compression coiled springs 29 sustain the cover member 20 in its raised position not to apply unnecessary tensions to the follower portions 34a, referred later, of the contacts 30 when the contacts 30 and the semiconductor package 50 come into contact, as shown in FIG. 2.

Next, the contacts 30 are members that electrically connect the semiconductor package 50 with a test board (not shown), and hence formed by pressing from a conductive metal sheet.

The contact 30, in the present embodiment, includes two contact pieces, i.e. a first contact piece 31 and a second contact piece 32, a connecting piece 33, a drive lever 34, an S-curve portion 35, a fixed portion 36 and a terminal portion 37 as shown in FIG. 4.

The first contact piece 31 extends frontward from one end of the connecting piece 33, whose tip portion 31*a* is formed so as to be in contact with the upper surface of the dam wall 11*a* of the package rest 11 when the IC socket 1 is in a free state as shown in FIG. 4. The tip portion 31*a* of the first contact piece 31 is in contact with the upper surface of the dam wall 11*a* at a predetermined contact pressure, due to the elastic force of the S-curve portion 35. As a result, the S-curve portion 35 determines the pressure that the tip portion 31*a* of the first contact piece 31 is in contact with the lead 52 of the semiconductor package 50. The tip portion 31*a* of the first contact piece 31 is also formed such that it depicts a path generally arcuate in form shown by the arrow X in FIG. 5 and goes into contact, from obliquely above, with the upper surface of the dam wall 11*a* or leaves obliquely above from the upper surface of the dam wall 11*a* when advancing or retracting relative to the upper surface of the dam wall 11*a*.

In the present embodiment, the second contact piece 32 includes a tip portion 32*a*, a first arm 32*b*, a U-curve portion 32*e* and a second arm 32*f*.

The second arm 32*f* of the second contact piece 32 extends downward along the S-curve portion 35 from an intermediate point where the first contact piece 31 extends frontward from one end of the connecting piece 33. Continuously, the first arm 32*b* of the second contact piece 32 extends up toward the tip portion 32*a* through the U-curve portion 32*e* serving as an elastic deforming member extending curving in a U-form to be elastically deformed.

The first arm 32*b* has intermediately a C-bend portion 32*c* following the tip portion 32*a* and a delaying protrusion 32*d*, referred later. The first arm 32*b* is formed nearly in parallel with the second arm 32*f*, in a portion extending from the U-curve portion 32*e* to the C-bend portion 32*c*. The first arm 32*b*, continuously, is bent generally arcuately at the C-bend portion 32*c* toward the forward upper (leftward upper in FIG. 4), continuing to the tip portion 32*a*. Consequently, below the tip portion 32*a*, a space S is formed surrounded by the tip portion 32*a* and the C-bend portion 32*c* of the first arm 32*b*. Forming such a space enables to cope with the case that the leads 52 of the semiconductor package 50 are arranged outer due to the dimensional errors of the semiconductor package 50 or that leads 52 themselves are formed dimensionally long outward.

The tip portion 32*a* of the second contact piece 32 is lower in position than the tip portion 31*a* of the first contact piece 31, as clearly shown also in FIG. 4. The tip portion 32*a* of the second contact piece 32 is formed so as to be in contact with the outer side surface of the dam wall 11*a* of the package rest 11 when the IC socket 1 is in a free state as shown in F*ig*. 4. The tip portion 32*a* of the second contact piece 32 is in contact with the outer side surface of the dam wall 11*a* at a predetermined contact pressure, due to the elastic force of the U-curve portion 32*e*. As a result, the U-curve portion 32*e* of the second contact piece 32 determines the pressure that the tip portion 32*a* of the second contact piece 32 is in contact with the lead 52 of the semiconductor package 50. In other words, the U-curve portion 32*e* of the second contact piece 32 can adjust the pressure the tip portion 32*a* of the second contact piece 32 is in contact with the lead 52 of the semiconductor package 50 to a contact pressure different from the contact pressure directly provided from the S-curve portion 35 as in the conventional. Specifically, in the present embodiment, it can be adjusted to a contact pressure smaller than the contact pressure directly provided from the S-curve portion 35. The tip portion 32*a* of the second contact piece 32 is also formed such that it depicts a path generally arcuate in form shown by the arrow Y in FIG. 5 and goes into contact, laterally (from right side in FIG. 5), with the outer side surface of the dam wall 11*a* or leaves laterally from the outer side surface of the dam wall 11*a* when advancing or retracting relative to the outer side surface of the dam wall 11*a* (right side surface of the dam wall 11*a*, in FIG. 4).

The tip portion 32*a* of the second contact piece 32 is further formed such that it is in a position somewhat frontward rather than the tip portion 31*a* of the first contact piece 31 in a state no loads are applied to the second contact piece 32 (see FIG. 5).

In the present embodiment, the second contact piece 32 is further formed with a delaying protrusion 32*d* close to a point continuing to the first arm 32*b* extending above the U-curve portion 32*e*. The delaying protrusion 32*d* is formed to contact with and slide over the arcuate convex surface of a delaying cam protrusion 11*k* formed lower in the outer side surface of the package rest 11, as mentioned above. This structure allows the tip portion 32*a* of the second contact piece 32 to go into contact with the lead 52 later than the contacting of the tip portion 31*a* of the first contact piece 31 with the lead 52 of the semiconductor package 50. It can prevent further positively against the poor contact between the contact 30 and the lead 52, arranged in opposite positions, due to a leap-up of the semiconductor package 50 caused by the manufacture errors in the leads 52 of the semiconductor package 50 as described later.

The drive lever 34 of the contact 30 extends rearward vertically from the other end of the connecting piece 33, and a follower portion 34*a* is formed at the front end thereof. The follower portion 34*a* of the drive lever 34 is formed such that it is arranged corresponding to the cam surface 21*a* of the cam 21 of the cover member 20 when the IC socket 1 is in a free state shown in FIG. 4. Although the follower portion 34*a* may be in contact with the cam surface 21*a* when the IC socket 1 is in a free state, it is preferably somewhat distant from the cam surface 21*a* as shown in FIG. 4.

The S-curve portion 35 of the contact 30, in the present embodiment, is an elastic deforming member capable of elastically deforming the contact 30, which is not necessarily limited to an S-curve form. The S-curve portion 35 extends downward from the connecting piece 33 in a manner being orthogonal to the connecting piece 33, and is connected to the fixed portion 36. The S-curve portion 35 allows the contact 30 to elastically deform as mentioned above so that, by vertical movement of the cover member 20, the respective tip portions 31*a*, 32*a* of the first and second contact pieces 31 and 32 of the contact 30 can be advanced/retracted simultaneously. Namely, in the present embodiment, the S-curve portion 35 acts as a common elastic deforming member that causes the first contact piece 31 and second contact piece 32 of the contact 30 to advance/retract simultaneously and as an elastic deforming member that determines a contact pressure of the first contact piece 31 with the lead 52 of the semiconductor package 50.

The fixed portion 36 of the contact 30 has an engaging convex portion 36*a*, a support portion 36*b* and an engaging concave portion 36*c*, which are respectively formed to fit with the engaging concave portion 12*c* and engaging convex portion 12*b* of the socket base body 12. Incidentally, a protrusion is preferably provided above or below the engaging convex portion 36a in order to positively fix the contact 30 to the socket base body 12.

The terminal portions 37 of the contact 30 are formed in a manner projecting downward from the fixed portion 36. The terminal portions 37 of the contact 30 are preferably formed arranged in longitudinally deviated positions (left and right in FIG. 4) in order to avoid the overlap with the terminal portion 37 of the adjacent contact 30 in the arrangement direction. By deviating in this manner the positions of the terminal portions 37 of the contact 30, it is possible to take great the spacing between a through-hole and the adjacent through-hole that are formed in the test board even where the number of contacts is great.

Although the structure of the IC socket 1 according to the present embodiment was explained so far, explanation is made from now on for the IC socket 1 operation of attaching a semiconductor package 50 in the IC socket 1 according to the present embodiment by use of FIGS. 4, 5, 6A and 7. Incidentally, although not shown in the figures, the IC socket 1 is mounted on a test board.

In FIG. 4, IC socket 1 is shown that is in a free state the semiconductor package 50 is not attached. At this time, the cover member 20 is in a first position where is raised most highly relative to the socket base 10. Meanwhile, the tip portion 31a of the first contact piece 31 of the contact 30 is in contact, from above at a predetermined contact pressure, with the upper surface on the dam wall 11a of the package rest 11 of the socket base 10 while the tip portion 32a of the second contact piece 32 is in contact, at a predetermined contact pressure, with the outer side surface of the dam wall 11a.

From the free state of the IC socket 1, the cover member 20 is pushed down, by a package attaching machine for example, to a second position where the cover member 20 is in an abutment state against the socket base body 12, as shown in FIG. 5 (i.e. lowering the cover member 20 from the first position to the second position). In the course of pushing down of the cover member 20, the follower portion 34a of the drive lever 34 of the contact 30 comes into abutment against the cam surface 21a provided at the cam 21 of the cover member 20. By further pushing down of the cover member 20, the follower portion 34a of the drive lever 34 moves rearward (rightward in FIG. 4) along the cam surface 21a. By doing so, the first and second contact pieces 31, 32 of the contact 30 are retracted rearward from the dam wall 11a while depicting paths generally arcuate in form respectively shown by the arrows X and Y, as shown in FIG. 5.

When the cover member 20 is in the second position shown in FIG. 5, the respective tip portions 31a, 32a of the first and second contact pieces 31, 32 of the contact 30 are retracted into the slits 11h formed in the frame member 11g of the package rest 11. The positioning members 11e of the package rest 11 rise relatively as the cover member 20 lowers, and lie in the opening 24 of the cover member 20.

When the IC socket 1 is in the state of FIG. 5, the semiconductor package 50 is placed on the package rest 11, for example, by a package attaching machine through the opening 24 and the positioning member 11e. At this time, the body 51 of the semiconductor package 50 is positioned in the dam wall 11a and sustained on the support protrusions 11b. The leads 52 of the semiconductor package 50 are put over the dam wall 11a and supported by the dam wall 11a. Specifically, the horizontal shoulder portions 52a of the gull-wing leads 52 are supported on the upper surface of the dam wall 11a while the vertical leg portions 52b of the leads 52 are arranged along the outer side surface of the dam wall 11a in a manner sandwiching the dam wall 11a between the vertical leg portions 52b and the body 51 of the semiconductor package 50.

If the pressing force to the cover member 20 is released after placing the semiconductor package 50 on the package rest 11 of the IC socket 1 shown in FIG. 5, the cover member 20 rises towards the first position by the restoration forces of the S-curve portion 35 of the contact 30 and the compression coil spring 29. Due to this, the follower portion 34a of the drive lever 34 advances along the cam surface 21a of the cover member 20. Consequently, the first contact piece 31 and second contact piece 32 of the contact 30 also advance toward the dam wall 11a.

As shown in FIG. 6A, in the present embodiment, as the second contact piece 32 of the contact 30 advances, the delaying protrusion 32d provided on the second contact piece 32 goes into contact with the delaying cam protrusion 11k provided on the package rest 11. Due to this, the tip portion 32a of the second contact piece 32 is prevented from advancing until the delaying protrusion 32d has gotten over the delaying cam protrusion 11k. Consequently, as shown in FIG. 6A, the tip portion 31a of the first contact piece 31 first goes into contact, from obliquely above, with the horizontal shoulder portion 52a of the lead 52 of the semiconductor package 50.

By structuring an electric contact between the contacts 30 and the semiconductor package 50 in this manner, poor electric contact due to leap up of the semiconductor package 50 can be prevented with further positiveness. Specifically, consider the case where, for example, variation is caused due to manufacturing errors in the shape of the oppositely extended leads 52 of the semiconductor package 50. If there is variation in the shape of the leads 52 in this manner, even if the tip portion 31a of the first contact piece 31 of one contact 30 is contacted with the horizontal shoulder portion 52a of the corresponding lead 52, there is a fear that the tip portion 31a of the other, opposite first contact piece 31 is not still in contact. If so, the semiconductor package 50 leaps up at the side where the lead 52 and the contact 30 are not in contact, resulting in a fear of poor contact between the lead 52 and the contact 30. However, in the IC socket 1 according to the present embodiment, the tip portion 31a of the other, first contact piece 31 is structured in a manner substantially nearing the above of the horizontal shoulder portion 52a of the lead 52. Consequently, the tip portion 31a of the other, first contact piece 31 goes into contact with the horizontal shoulder portion 52a from above when the horizontal shoulder portion 52a of the lead 52 leaps up less in amount, which makes it possible to suppress the semiconductor package 50 from leaping up completely.

Subsequently, as the cover member 20 rises furthermore, the second contact piece 32 further advances toward the dam wall 11a and hence toward the vertical leg portion 52b of the gull-wing lead 52. Due to this, the delaying protrusion 32d of the second contact piece 32 gets over the delaying cam protrusion 11k with a result that the tip portion 32a of the second contact piece 32 laterally goes into contact with the vertical leg portion 52b of the gull-wing lead 52 with a somewhat delay from the first contact piece 31. At this time, the second contact piece 32 makes contact, at a smaller contact pressure, with the vertical leg portion 52b by virtue of the provision of the U-curve portion 32e, which therefore does not deform the vertical leg portion 52b.

As shown in FIG. 7, attaching the semiconductor package 50 to the IC socket 1 is completed by completely rising of the cover member 20 to the first position.

The removal operation of the semiconductor package 50 from the IC socket 1 may be performed reverse to the attachment operation mentioned above, and hence the explanation thereof is omitted.

In the meanwhile, the present embodiment was explained that the tip portion 31a of the first contact piece 31 of the contact 30 goes into contact with the gull-wing lead 52 earlier than the tip portion 32a of the second contact piece 32. However, electric contact between the contact 30 and the semiconductor package 50 is not limited to this. For example, as in the modification shown in FIG. 6B, the tip portion 32a of the second contact piece 32 may be structured to go into contact with the gull-wing lead 52 earlier than the tip portion 31a of the first contact piece 31. Otherwise, both tip portions 31a and 32a may go into contact nearly simultaneously.

Here, the modification to first embodiment shown in FIG. 6B is explained briefly. The modification shown in FIG. 6B is structured for the tip portion 32a of the second contact piece 32 to go into contact with the gull-wing lead 52 earlier than the tip portion 31a of the first contact piece 31. Specifically, the IC socket 1 according to the modification shown in FIG. 6B differs from the first embodiment only in that the delaying cam protrusion 11k provided in the package rest 11 and the delaying protrusion 32c provided in the second contact piece 32 are not provided. Namely, the tip portion 32a of the second contact piece 32 is in a frontward position rather than the tip portion 31a of the first contact piece 31 when the cover member 20 is in the second position as shown in FIG. 5. When the push force to the cover member 20 is canceled, the tip portion 32a of the second contact piece 32 keeps the positional relationship and advances toward the lead 52. In the present modification, because the second contact piece 32 is free from delay, the tip portion 32a of the second contact piece 32 laterally goes into contact, earlier, with the vertical leg portion 52b of the gull-wing lead 52. Then, the tip portion 31a of the first contact piece 31 goes into contact with the horizontal shoulder portion 52a of the gull-wing lead 52 from above.

In the case of the present modification, because the second contact piece 32 is formed smaller in elastic force as compared to the conventional one, the tip portion 32a of the second contact piece 32 merely pushes laterally the vertical leg portion 52b of the gull-wing lead 52 of the semiconductor package 50 by means of a weak elastic force. Consequently, even where there is variation as mentioned above in the shape of the leads 52 of the semiconductor package 50, the semiconductor package 50 is not leaped up even if the tip portion 32a of one second contact piece 32 of the opposed second contact pieces 32, 32 goes into contact, earlier, with the corresponding vertical leg portion 52b. Namely, because the tip portion 32a of the other contact piece of the opposed second contact pieces 32 is close to the corresponding vertical leg portion 52b, the semiconductor package 50 is soon placed into a sandwiched state by the opposed second contact pieces 32, 32 through the corresponding vertical leg portions 52b, 52b. Consequently, in also the present modification, the contacts 30 and the semiconductor package 50 are prevented from becoming poor in electric contact due to leap up of the semiconductor package 50.

As described so far, the IC socket 1 according to the first embodiment and modification of the invention is characterized in that the tip portion 31a of the first contact piece 31 of the contact 30 is to make contact with the upper surface of the dam wall 11a and the tip portion 32a of the second contact piece 32 is to make contact with the outer side surface of the dam wall 11a. Meanwhile, the second contact piece 32 is characterized by further having an elastically deformable U-curve portion 32e in addition to the S-curve portion of the contact 30.

Accordingly, when the contact 30 goes into contact with the semiconductor package 50 placed on the package rest 11, the tip portion 31a of the first contact piece 31 of the contact necessarily comes into contact, from above, with the horizontal shoulder portion 52a of the gull-wing lead 52 of the semiconductor package 50. Meanwhile, the tip portion 32a of the second contact piece 32 necessarily comes into contact, at a small contact pressure, with the vertical leg portion 52b of the gull-wing lead 52 of the semiconductor package 50. Due to this, no deformations are caused in the gull-wing leads 52 of the semiconductor package 50. Furthermore, poor electric contact due to leap-up of the semiconductor package can be positively suppressed.

Second Embodiment

Figure 8:
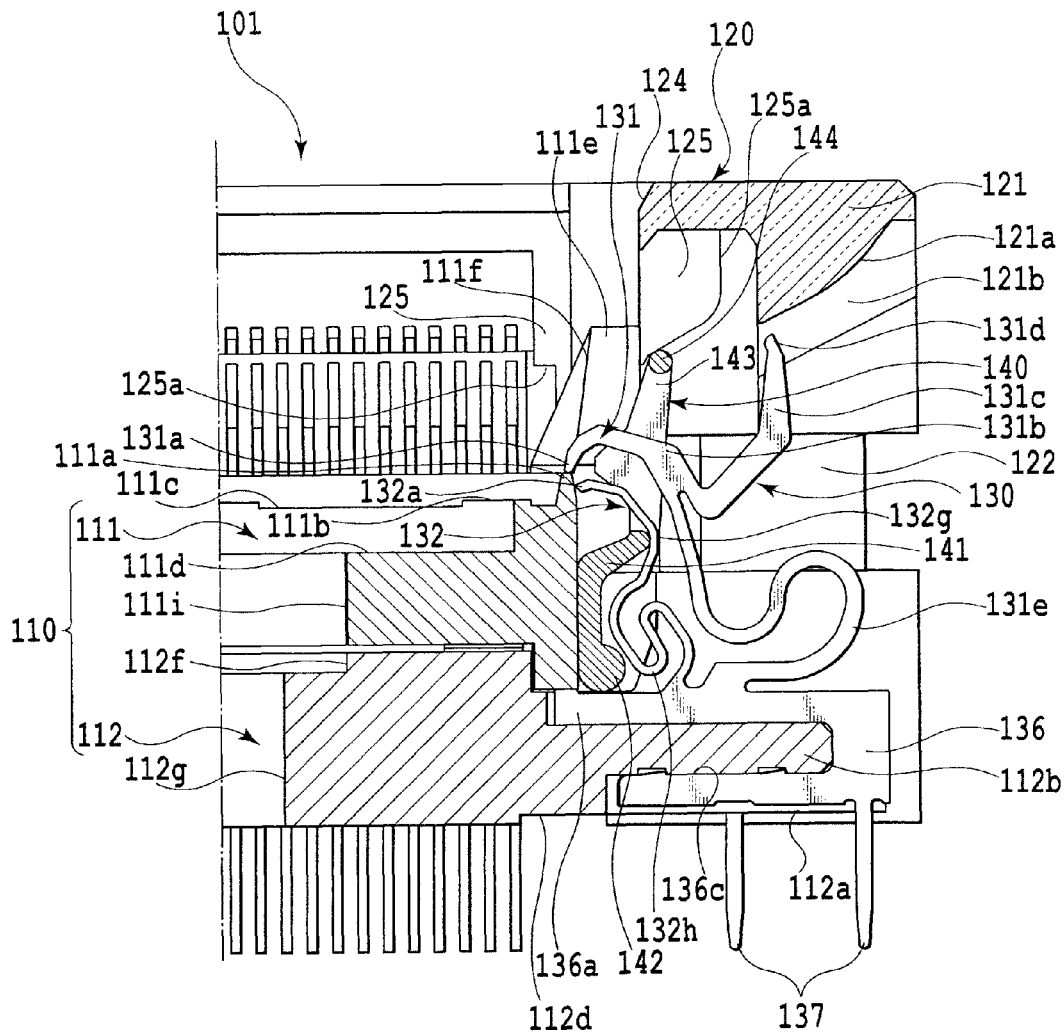
FIG. 8 is a partial sectional view in a generally right half of the two-point-contact type IC socket according to a second embodiment of the invention.
Figure 9:
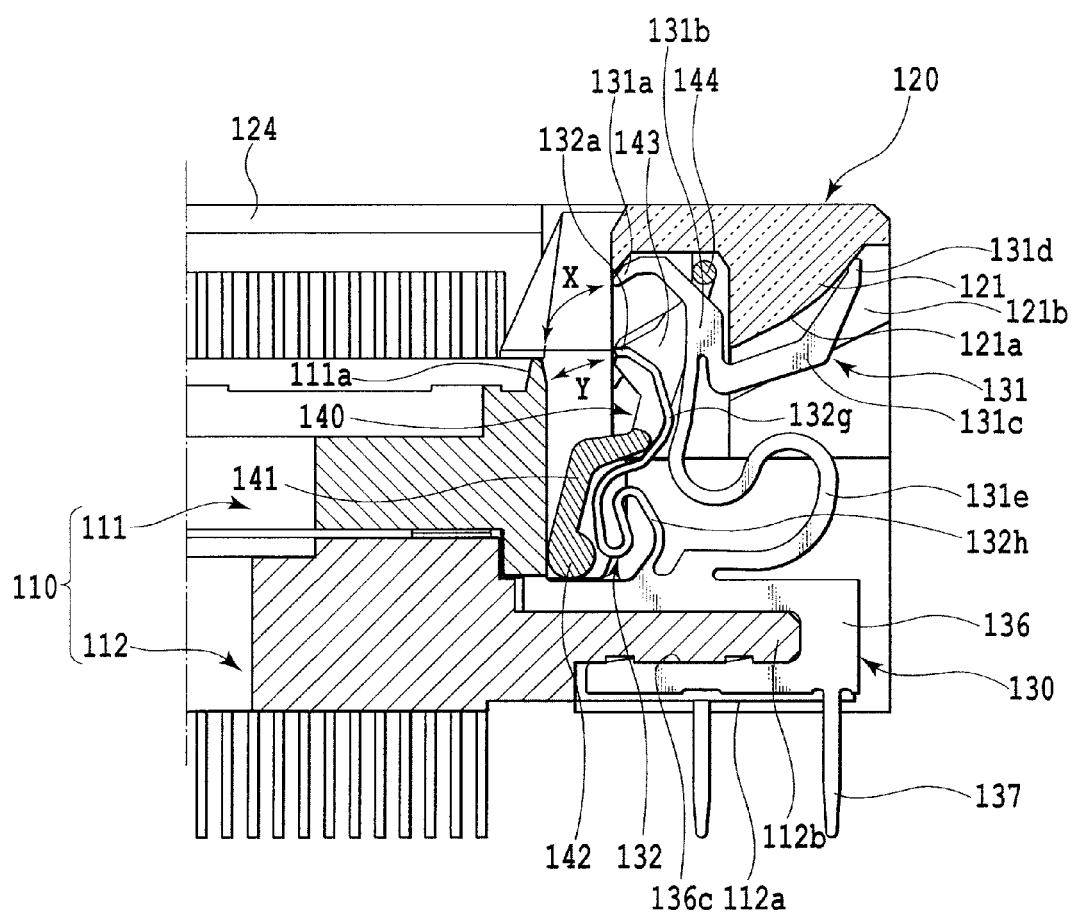
FIG. 9 is a partial sectional view in a generally right half of the two-point-contact type IC socket according to the second embodiment that is similar to FIG. 8, showing a state that the contacts of the IC socket shown in Fig. 8 are opened in order to attach a semiconductor package.
Figure 10A:
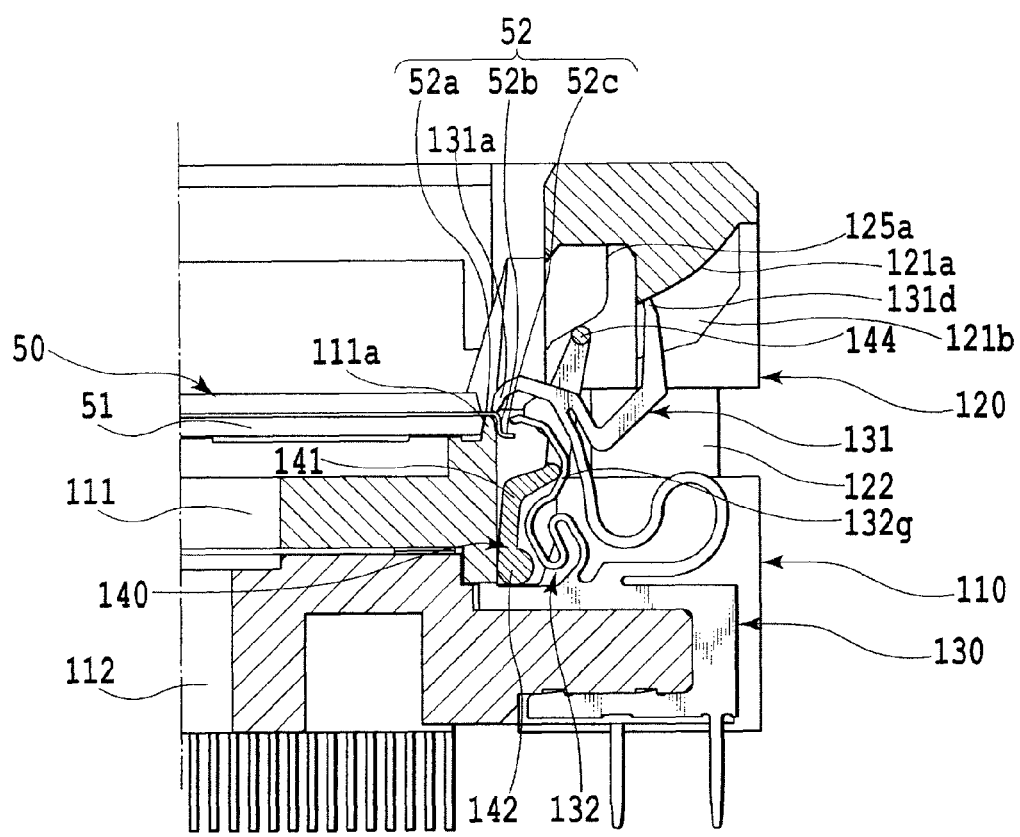
Figure 10B:
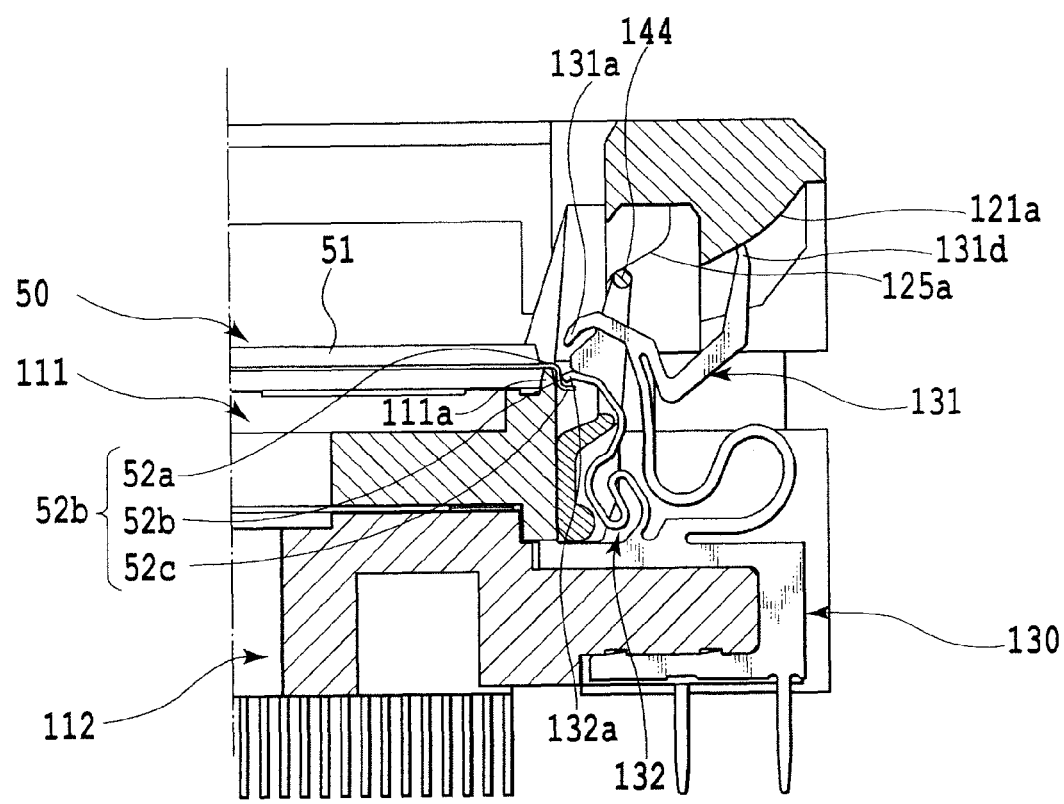
Figure 11:
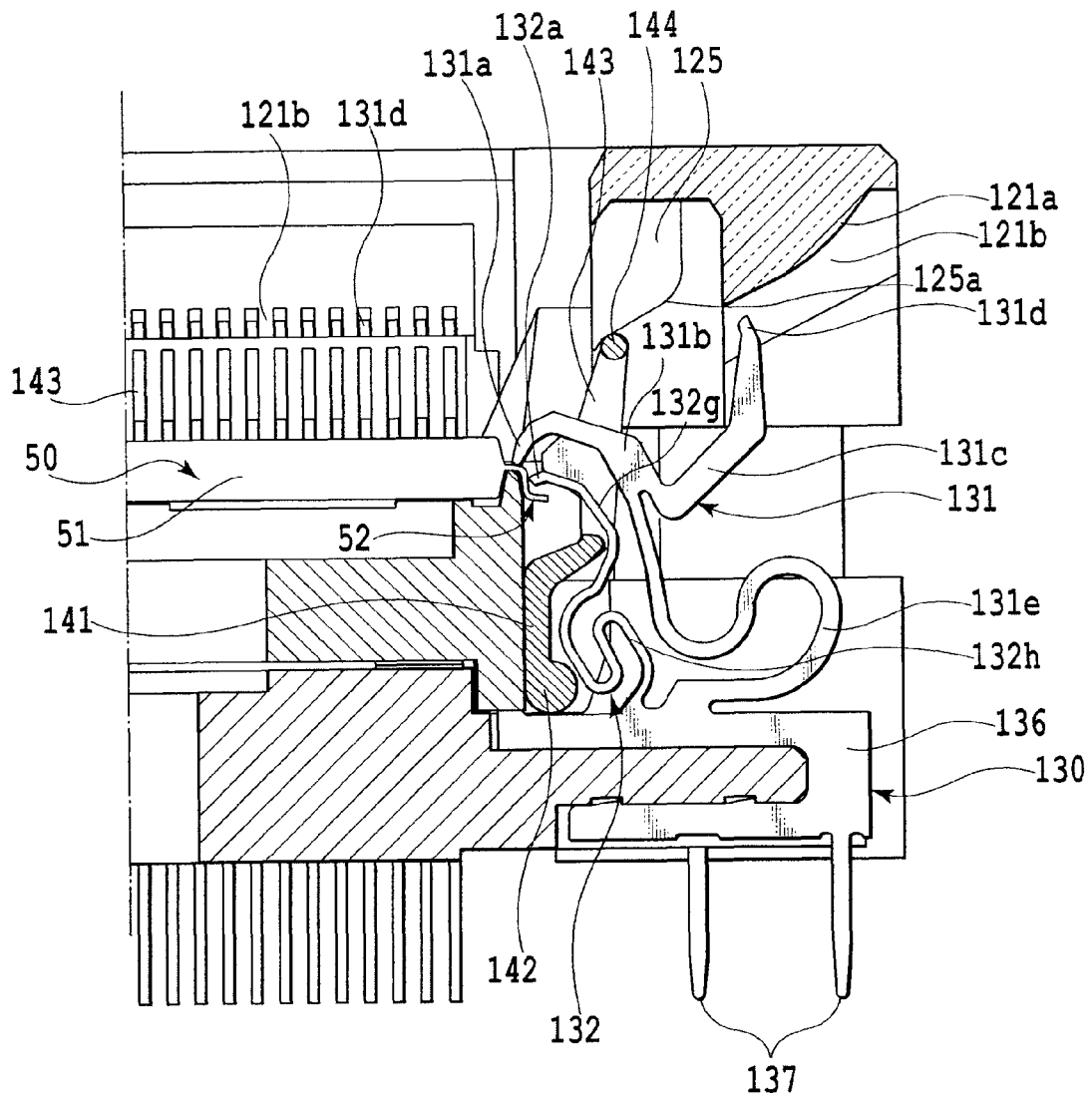
FIG. 11 is a partial sectional view in a generally right half of the two-point-contact type IC socket according to the second embodiment that is similar to FIG. 8, showing a state that first and second, two, contact pieces of the contact are contacted with the lead of a semiconductor package placed on and attaching the semiconductor package is completed.

FIGS. 8 to 11 show a two-point-contact type IC socket according to a second embodiment and its modification of the invention. FIG. 8 is a partial sectional view in a generally right half of the two-point-contact type IC socket according to a second embodiment. FIG. 9 is a partial sectional view in a generally right half of the two-point-contact type IC socket according to the second embodiment that is similar to FIG. 8, showing a state that the contacts of the IC socket shown in FIG. 8 are opened in order to attach a semiconductor package. FIG. 10A is a partial sectional view in a generally right half of the two-point-contact type IC socket according to the second embodiment that is similar to FIG. 8, showing a state that a first contact piece of the contact first goes into contact with the lead of a semiconductor package placed on. FIG. 10B is a partial sectional view in a generally right half of a two-point-contact type IC socket according to a modification to a second embodiment that is similar to FIG. 8, showing a state that a second contact piece of the contact first goes into contact with the lead of a semiconductor package placed on. FIG. 11 is a partial sectional view in a generally right half of the two-point-contact type IC socket according to the second embodiment that is similar to FIG. 8, showing a state that first and second, two, contact pieces are in contact with the lead of a semiconductor package being placed and the semiconductor package is completed in attachment.

In also the two-point-contact type IC socket 101 of the present embodiment, a QFP (quad flat package) type semiconductor package 50 is to be assumably attached whose leads 52 are extended from four side surfaces of a generally square package body 51 and formed in a gull-wing form.

The two-point-contact type IC socket 101 of the present embodiment is formed generally square as viewed from above, taking the entire form of a rectangular parallelepiped. The two-point-contact type IC socket 101 of the present embodiment, similarly to the first embodiment, has a socket base 110, a cover member 120, a plurality of contacts 130 and a rotary frame member 140 that drives a second contact piece 132 of the contact 130, as shown in FIG. 8. Accordingly, the IC socket 101 in the present embodiment is different in the structure of the contact 130 and in the provision of a rotary frame member 140 that drives the second contact piece 132 of the contact 130, from the IC socket 1 of the first embodiment. Although the structure of a base body 112 and cover member 120 of a socket base 110 is somewhat changed due to the difference, the other structure is nearly the same. Accordingly, explanation is mainly on the different structure in the following, to omit the explanation of the other structure having nearly the same structure. Incidentally, in the present embodiment, it is to be understood that, in case the figure subtracted 100 from the figure used for a component is the same as the figure (and alphabet) used for a component in the first embodiment, it refers to the same component as the component in the first embodiment.

The socket base 110 in the present embodiment includes a package rest 111 and a socket base body 112, similarly to the first embodiment. The package rest 111 is nearly the same as the first embodiment, wherein the socket base body 112 is substantially unchanged except for the somewhat difference in the fitting structure with the fixed portion 136 of the contact 130. In the present embodiment, the fitting structure of the socket base body 112 with the fixed portion 136 of the contact 130 is formed with only an engaging convex portion 112b without the provision of an engaging concave portion, as shown in FIG. 8 for example.

Next, the cover member 120 in the present embodiment is generally in the form of a rectangular parallelepiped similarly to the first embodiment, having a guide member 122 supporting the cover member 120 vertically movably relative to the socket base body 112 and an opening 124 allowing a positioning member 111e on the package rest 111 to move in/out.

In the present embodiment, the cover member 120 is different in structure from the first embodiment in that it has further a second cam 125 in addition to a first cam 121 similar to the first embodiment.

The first cams 121 are formed along the four side regions of the cover member 120, nearly similarly to the first embodiment. The first cam 121 has a first cam surface 121a that is formed along the lower and side surfaces of the first cam 121 and formed between the adjacent ones of the partition walls 121b. The first cam surfaces 121a are formed in plurality correspondingly to the drive levers 131c that drive the first contact pieces 131 of the contacts 130 fixed by the socket base body 112. The first cam surfaces 121a are formed such that, when the cover member 120 is pushed down, those abut against the drive levers 131c of the first contact pieces 131 of the contacts 130 so that the first contact pieces 131 of a plurality of contacts 130 can be moved from the inner to the outer at the same time.

The second cams 125 are formed at four corners of the cover member 120 such that those are opposed at four side regions of the cover member 120, wherein the second cams 125 each have lower and side surfaces in which a second cam surface 125a is formed. The second cam surfaces 125a are formed such that, when the cover member 120 is pushed down, those go into abutment against the follower bars 144 of the rotary frame members 140 arranged between the opposite, second cam surfaces 125a, 125a so that the second contact pieces 132 of the plurality of contacts 130 can be moved from the inner to the outer simultaneously.

Next, the contact 130 in the present embodiment includes a first contact piece 131, a second contact piece 132, a fixed portion 136 and a terminal portion 137, as shown in FIG. 8. The first contact piece 131 and the second contact piece 132, of the contact 130 in the present embodiment, are to be driven independently from each other. Namely, the first contact piece 131 and the second contact piece 132, in the present embodiment, extend from an upper surface of the fixed portion 136 so as to be able to displace independently from each other.

The first contact piece 131 of the contact 130 includes a tip portion 131a, a connecting piece 131b, a drive lever 131c, a follower portion 131d and an S-curve portion 131e serving as an elastic deforming member, and is connected to a rear (right-hand in FIG. 8) region of the fixed portion 136. The tip portion 131a is formed such that it is in contact, from above, with the upper surface of the dam wall 111a of the package rest 111 when the semiconductor package 50 is not placed on the package rest 111 and the IC socket 101 is in a free state, as shown in FIG. 8. The connecting piece 131b is connected with the tip portion 131a, the drive lever 131c and the S-curve portion 131e. The drive lever 131c is formed such that the follower portion 131d, i.e. a tip portion, corresponds to the first cam surface 121a provided in the cover member 120. The S-curve portion 131e of the first contact piece 131 allows the first contact piece 131 to deform elastically and determines a contact pressure of the tip portion 131a of the first contact piece 131 with the lead 52 of the semiconductor package 50.

The tip portion 131a of the first contact piece 131, when the cover member 120 is pushed down, is to be retracted obliquely above from the upper surface of the dam wall 111a by abutment of the follower portion 131d against the first cam surface 121a of the cover member 120. The advancing and retracting path of the tip portion 131a of the first contact piece 131 due to vertical movement of the cover member 120 is arcuate as shown by the arrow X in FIG. 9.

The second contact piece 132 of the contact 130 includes a tip portion 132a, a generally C-formed drive portion 132g and an S-curve portion 132h serving as an elastic deforming member, and is connected to a front (left-hand in FIG. 8) region of the fixed portion 136. The tip portion 132a is formed such that it is in contact, laterally, with the outer side surface of the dam wall 111a of the package rest 111 when the semiconductor package 50 is not placed on the package rest 111 and the IC socket 101 is in a free state, as shown in FIG. 8. The C-formed drive portion 132g is formed in a manner abutting against an upper end of the rotary lever 141 of the rotary frame member 140. The S-curve portion 132h of the second contact piece 132 allows the second contact piece 132 to deform elastically and determines a contact pressure of the tip portion 132a of the second contact piece 132 with the lead 52 of the semiconductor package 50.

The tip portion 132a of the second contact piece 132, when the cover 120 is pushed down, is to retract obliquely above from the outer side surface of the dam wall 111a by rotating the rotary lever 141 of the rotary frame member 140 and pushing the C-formed drive portion 132g rearward. The advancing and retracting path of the tip portion 132a of the second contact piece 132 due to vertical movement of the cover member 120 is arcuate as shown by the arrow Y in FIG. 9.

The fixed portion 136 of the contact 130 is a member that fixes the contact 130 to the socket base body 112 and formed with an engaging concave portion 136c with which the engaging convex portion 112b of the socket base body 112 fits, similarly to the first embodiment. The fixed portion 136 also supports rotatably a rotary shaft portion 142 of the rotary frame member 140, together with the outer side surface of the dam wall 111a of the package rest 111 and the upper surface of the partition wall 112a.

Next, the rotary frame member 140 is formed of an electrically insulated synthetic resin and generally rectangular in form as viewed from right in FIG. 8. The rotary frame member 140 includes a rotary lever portion 141, a rotary shaft portion 142, slits 143 and a follower bar 144. The rotary frame member 140 is arranged for rotation about the rotary shaft portion 142, between second cams 125 in pair formed at four corners of the cover member 120, as mentioned above.

The rotary frame member 140 is formed with a plurality of slits 143 extending anteroposteriorly (left-right direction in FIG. 8) through the rotary frame member 140. Partition walls defining between the adjacent slits 143 correspond to the partition walls 112a provided in the socket base body 112.

Accordingly, in each slit 143, the first contact piece 131 and second contact piece 132 of the contact 130 is arranged to advance and retract within the slit 143.

In the upper part of the rotary frame member 140, a follower bar 144 is formed in a manner extending across the slits 143 and closing the upper ends thereof. The follower bar 144 has both ends abutting against the second cam surfaces 125a, 125a oppositely formed respectively at opposite corners of the cover member 120, providing a structure that the both ends can slide along the second cam surfaces 125a, 125a when the cover member 120 moves vertically. Due to this, the rotary frame member 140 is to rotate about the rotary shaft portion 142. Incidentally, as shown in FIG. 8, when the cover member 120 is in the first position that is the highest relative to the socket base 110, the both ends of the follower bar 144 may be in contact with the second cam surface 125a but may be somewhat distant therefrom.

Below the rotary frame member 140, a rotary lever portion 141 is formed in a manner extending across the slits 143 and closing the lower end thereof. The rotary lever portion 141 is generally in a C-form in vertical section, the upper end of which is formed in a manner abutting against the C-formed drive portion 132g of the second contact piece 132 with the lower end connected to the rotary shaft portion 142. The rotary lever portion 141 is also formed such that its lower end and its vicinity connected to the rotary shaft portion 142 is vertically held by and in contact with the lower area of the outer side surface of the dam wall 111a of the package rest 111 when the IC socket 101 is in a free state, as shown in FIG. 8.

In the lower end of the rotary frame member 140, the rotary shaft portion 142 is provided that serves as a rotation center of the rotary frame member 140. The rotary shaft portion 142 is generally circular in vertical section, which protrudes outward (in the vertical direction to the drawing, in FIG. 8) from the both ends of the rotary frame member 140 and is rotatably supported in a circular hole (not shown) formed in the socket base body 112 or in an engaging groove (not shown) opened to the upper. Incidentally, the rotary shaft portion 142 may be provided with a helical torsion spring, for example. The helical torsion spring gives torque to the rotary shaft portion 142 such that the rotary shaft portion 142 of the rotary frame member 140 is in contact with and vertically held by the lower area of the outer side surface of the dam wall 111a.

The structure of the IC socket 101 according to the second embodiment has been explained so far mainly on the differences from the first embodiment. From now on, explanation is made on the handling procedure of the IC socket 1 for attaching a semiconductor package 50 on the IC socket 101 according to the present embodiment, with use of FIGS. 8, 9, 10A and 11. Incidentally, although not shown, the IC socket 101 in the present embodiment is also mounted on a test board.

FIG. 8 shows an IC socket 101 in a free state that a semiconductor package 50 is not attached. At this time, the cover member 120 is in the first position that is the highest relative to the socket base 110. Meanwhile, the tip portion 131a of the first contact piece 131 of the contact 130 is in contact, from above, with the dam wall 111a of the package rest 111 at a predetermined contact pressure while the tip portion 132a of the second contact piece 132 is in contact with the outer side surface of the dam wall 111a at a predetermined contact pressure.

From the free state of the IC socket 101, the cover member 120 is pushed down to the second position in which state the cover member 120 is in contact with the socket base 110, as shown in FIG. 9. In the course of pushing down the cover member 120, the follower portion 131d of the drive lever 131c of the first contact piece 131 of the contact 130 goes into abutment against the first cam surface 121a provided in the cover member 120. Likewise, the both ends of the follower bar 144 of the rotary frame member 140 go into abutment against the second cam surface 125a. As the cover member 120 is further pushed down, the follower portion 131d of the drive lever 131c and the both ends of the follower bar 144 move rearward (rightward in FIG. 8) respectively along the first cam surface 121a and the second cam surface 125a. Due to this, as shown in FIG. 9, the first and second contact pieces 131, 132 of the contact 130 are retracted rearward from the dam wall 111a while respectively depicting generally arcuate paths shown by the arrows X and Y.

When the cover member 120 is in the second position shown in FIG. 9, the respective tip portions 131a, 132a of the first and second contact pieces 131, 132 of the contact 130 are retracted rearward rather than the positioning member 111e of the package rest 111. Meanwhile, the positioning member 111e rises relatively as the cover member 120 lowers, and lies in the opening 124 of the cover member 120.

When the IC socket 101 is in the state of FIG. 9, the semiconductor package 50 is placed on the package rest 111 through the opening 124 and the positioning member 111e similarly to the first embodiment. At this time, the body 51 of the semiconductor package 50 and the horizontal shoulder portion 52a and vertical leg portion 52b of the gull-wing lead 52 are positioned over the package rest 111 similarly to the first embodiment.

If the push force to the cover member 120 is canceled after the semiconductor package 50 is placed on the package rest 111 of the IC socket 101 shown in FIG. 9, the cover member 120 rises toward the first position due to the restoration force of the S-curve portion 131e, 132e of the contact 130 and the compression coiled spring. Due to this, the follower portion 131d of the drive lever 131c and the follower lever 144 also advance respectively along the first cam surface 121a and the second cam surface 125a of the cover member 120. Consequently, the first contact piece 131 and second contact piece 132 of the contact 130 also advances toward the dam wall 111a.

As shown in FIG. 10A, in the present embodiment, the tip portion 131a of the first contact piece 131 first goes into contact, from obliquely above, with the horizontal shoulder portion 52a of the gull-wing lead 52 of the semiconductor package 50 by properly adjusting the shape of the first cam surface 121a, second cam surface 125a and drive lever 131c and rotary frame member 140. Accordingly, the present embodiment can positively prevent against poor electric contact due to leap up of the semiconductor package 50, similarly to the first embodiment.

Subsequently, when the cover member 120 rises furthermore, the second contact piece 132 further advances toward the dam wall 111a so that the tip portion 132a of the second contact piece 132 goes into contact, laterally, with the vertical leg portion 52b of the gull-wing lead 52 with a somewhat delay from the first contact piece 131. At this time, the second contact piece 132 makes contact with the vertical leg portion 52b through the S-curve portion 132h at a small contact pressure. Therefore, there is no possibility of causing a deformation in the vertical leg portion 52b.

As shown in FIG. 11, attaching the semiconductor package 50 onto the IC socket 101 is completed by completely rising of the cover member 120 to the first position.

The removal operation of the semiconductor package 50 out of the IC socket 101 may be performed by reverse performing the attaching operation described in the above, and hence the operation thereof is omitted.

In also the present embodiment, explanation is made briefly on a modification that the tip portion 132a of the second contact piece 132 of the contact 130 goes into contact with the lead 52 of the semiconductor package 50 earlier than the tip portion 131a of the first contact piece 131, as shown in FIG. 10B. In the IC socket 101 according to the modification shown in FIG. 10B, the follower bar 144 of the rotary frame member 140 can be shortened in returning by forming, for example, a second cam surface 125a in a position somewhat upper than that in the second embodiment. Due to this, the tip portion 132a of the second contact piece 132 can make contact, laterally, with the vertical leg portion 52b of the gullwing lead 52 earlier than the tip portion 131a of the first contact piece 131. The tip portion 131a of the first contact piece 131, immediately after that, comes into contact, from above, with the horizontal shoulder portion 52a of the gullwing lead 52.

In also the present modification, the second contact piece 132 merely pushes laterally the vertical leg portion 52b of the gull-wing lead 52 of the semiconductor package 50 at a weak elastic force. Therefore, there is no possibility of causing the semiconductor package 50 to leap up, similarly to the first embodiment.

As described above, the IC socket 101 according to the second embodiment and modification of the invention is characterized in that the tip portion 131a of the first contact piece 131 of the contact 130 is to make contact with the upper surface of the dam wall 111a and the tip portion 132a of the second contact piece 132 is to make contact with the outer side surface of the dam wall 111a, similarly to the above first embodiment. In addition, the second contact piece 132 is characterized by having an elastically deformable S-curve portion 132h separately from the S-curve portion 131e of the first contact piece 131. As a result, the gull-wing lead 52 of the semiconductor package 50 is not deformed. Furthermore, poor electric contact due to leap up of the semiconductor package can be suppressed positively.

The invention claimed is:

1. A two-point-contact type semiconductor package socket comprising:
    a socket base including a package rest on which a semiconductor package is to be placed that has gull-wing leads including at least a horizontal shoulder portion extending nearly horizontally from a main body and a vertical leg portion being bent nearly vertically from the horizontal shoulder portion;
    a cover member vertically movably attached on the socket base through an elastic member;
    a plurality of contacts each including at least a first contact piece capable of making contact, from above, with the horizontal shoulder portion of the gull-wing lead of the semiconductor package placed on the package rest, a second contact piece capable of making contact, laterally, with the vertical leg portion of the gull-wing lead of the semiconductor package and a fixed portion that is fixed in the socket base, and formed to advance onto the package rest or retract from the package rest due to vertical movement of the cover member;
    wherein, the package rest is formed with a dam wall that allows the gull-wing lead of the semiconductor package to lie thereover when the semiconductor package is placed on;
    the first contact piece and the second contact piece, of the contact, each have an elastic deforming portion that is elastically deformable to determine a contact pressure in a manner making contact with the gull-wing lead of the semiconductor package at a predetermined contact pressure;
    the timing of making contact the first contact piece and the second contact piece with the semiconductor package is delayed.

2. A two-point-contact type semiconductor package socket according to claim 1, wherein the timing of making contact the first contact piece and the second contact piece with the semiconductor package is delayed by providing a delay protrusion in the contact.

3. A two-point-contact type semiconductor package socket according to claim 1, wherein the timing of making contact the first contact piece and the second contact piece with the semiconductor package is delayed by providing a delay cam protrusion in the package rest.

4. A two-point-contact type semiconductor package socket according to claim 1, wherein the cover member is vertically movably attached on the socket base by means of guide members provided at four corners.

5. A two-point-contact type semiconductor package socket comprising:
    a socket base including a package rest on which a semiconductor package is to be placed that has gull-wing leads including at least a horizontal shoulder portion extending nearly horizontally from a main body and a vertical leg portion being bent nearly vertically from the horizontal shoulder portion;
    a cover member vertically movably attached on the socket base through an elastic member;
    a plurality of contacts each including at least a first contact piece capable of making contact, from above, with the horizontal shoulder portion of the gull-wing lead of the semiconductor package placed on the package rest, a second contact piece capable of making contact, laterally, with the vertical leg portion of the gull-wing lead of the semiconductor package and a fixed portion that is fixed in the socket base, and formed to advance onto the package rest or retract from the package rest due to vertical movement of the cover member;
    wherein, the package rest is formed with a dam wall that allows the gull-wing lead of the semiconductor package to lie thereover when the semiconductor package is placed on;
    the first contact piece and the second contact piece, of the contact, each have an elastic deforming portion that is elastically deformable to determine a contact pressure in a manner making contact with the gull-wing lead of the semiconductor package at a predetermined contact pressure, and respective elastic deforming portions are formed to advance onto the package rest or retract from the package rest due to vertical movement of the cover member;
    in order to elastically deform the first contact piece, the first contact piece includes a drive lever having a follower portion that slides along a first cam surface formed in the cover member, and in order to elastically deform the second contact piece, a rotary frame member having a follower bar that slides along a second cam surface formed in the cover member, a plurality of slits provided below the follower bar and allowing the plurality of contacts to pass through, a rotary lever portion provided below the slits and having an upper end in contact with the second contact piece and a rotary shaft portion provided below the rotary lever portion is rotatably supported by an upper surface of the fixed portion of the contact and an outer side surface of the package rest; and
    the timing of making contact the first contact piece and the second contact piece with the semiconductor package is delayed.

6. A two-point-contact type semiconductor package socket according to claim 5, wherein the cover member is vertically movably attached on the socket base by means of guide members provided at four corners.

\* \* \* \* \*